United States Patent [19]

Tamura et al.

[11] Patent Number: 4,498,951
[45] Date of Patent: Feb. 12, 1985

[54] METHOD OF MANUFACTURING SINGLE-CRYSTAL FILM

[75] Inventors: Masao Tamura, Tokorozawa; Naotsugu Yoshihiro, Matsudo; Nobuyoshi Natsuaki, Kodaira; Masanobu Miyao, Tokorozawa; Makoto Ohkura, Hachioji; Hideo Sunami, Nishitama; Takashi Tokuyama, Higashikurume, all of Japan

[73] Assignee: Hitachi, Ltd., Tokyo, Japan

[21] Appl. No.: 423,206

[22] Filed: Sep. 24, 1982

[30] Foreign Application Priority Data

Oct. 9, 1981 [JP] Japan ................................ 56-160193

[51] Int. Cl.³ .............................................. C30B 25/04
[52] U.S. Cl. .................................. 156/612; 156/617 R; 156/DIG. 80; 156/DIG. 111
[58] Field of Search ............ 156/603, 613, 614, 617 R, 156/620, DIG. 64, DIG. 70, DIG. 80, DIG. 88, DIG. 105, DIG. 11, 612; 148/1.5, 175; 29/576 T, 576 B; 427/53.1, 86, 93, 95

[56] References Cited

U.S. PATENT DOCUMENTS

| 4,174,217 | 11/1979 | Flatley | 427/93 |
| 4,292,091 | 9/1981 | Togei | 148/187 |
| 4,308,078 | 12/1981 | Cook | 156/DIG. 80 |
| 4,323,417 | 4/1982 | Lam | 156/DIG. 80 |
| 4,330,363 | 5/1982 | Biecesen et al. | 156/DIG. 80 |
| 4,338,139 | 7/1982 | Shinada | 29/576 T |
| 4,377,031 | 3/1983 | Goto et al. | 29/576 B |

FOREIGN PATENT DOCUMENTS

| 2483127 | 11/1981 | France | 29/576 T |
| 68897 | 6/1977 | Japan | 156/DIG. 111 |
| 88317 | 7/1981 | Japan | 427/93 |
| 126914 | 10/1981 | Japan | 156/DIG. 88 |

OTHER PUBLICATIONS

H. W. Lam et al., Single Crystal Silicon-On-Oxide by a Scanning CW Laser Induced Lateral Seeding Process, J. Electrochemical Soc. Solid-State Science and Technology, Sep. 1981, pp. 1981-1986.

Primary Examiner—David L. Lacey
Attorney, Agent, or Firm—Antonelli, Terry & Wands

[57] ABSTRACT

The whole surface of a polycrystalline or amorphous semiconductor film deposited so as to continuously cover the surface of a single-crystal substrate and an insulating film is irradiated with a laser beam or electron beam, thereby to selectively melt only those parts of the polycrystalline or amorphous semiconductor film which overlie the insulating film. Thus, a single-crystal semiconductor film is formed only the insular insulating film formed on the single-crystal substrate.

18 Claims, 5 Drawing Figures

METHOD OF MANUFACTURING SINGLE-CRYSTAL FILM

BACKGROUND OF THE INVENTION

1. Field of the Invention

The present invention relates to a method of manufacturing a single-crystal film, and more particularly to a method of manufacturing a semiconductor single-crystal film on selected areas of an insulating film which is formed on a semiconductor single-crystal substrate.

2. Description of the Prior Art

As is well known, there have been proposed several methods in which a single-crystal film is grown on an insulating film by the use of a laser beam or electron beam.

The first method is as illustrated in FIG. 1a, and comprises forming recesses in the surface of an insulator, such as $SiO_2$, 1, thereafter depositing an amorphous silicon film 2 and turning the amorphous silicon into a single crystal by irradiation with the laser. It is said that, with this method, the parts of the amorphous silicon film 2 deposited in the recesses are first turned into the single crystal, whereupon the other part is successively turned into the single crystal.

This method, however, is difficult to be put into practical use because, not only difficulty is involved in the control of steps such as the formation of the grooves in the surface of the insulator, but also the characteristics of the single-crystal film produced are unsatisfactory.

The second method is as illustrated in FIG. 1b, and comprises depositing an amorphous silicon film 2 on a predetermined area of the surface of an insulator 1 and turning the amorphous silicon film 2 into a single crystal by irradiation with the laser.

Although only an insular silicon film which is as small as several $\mu m \times$ several tens $\mu m$ can be turned into the single crystal by this method, a non-defective layer having a good crystal orientation is obtained.

This method, however, has the serious problem that the insular amorphous silicon film is melted by the laser irradiation, so the shape collapses. In order to prevent such collapse of the shape ascribable to the laser irradiation, there has been proposed, e.g., an expedient in which the insular amorphous silicon film is surrounded with an $SiO_2$ film. Since, however, the expedient results in an extremely complicated process, it is difficult to be put into practical use.

SUMMARY OF THE INVENTION

An object of the present invention is to solve the problems of the prior arts, and to provide a method in which an amorphous or polycrystalline silicon film deposited on an insulating film can be readily turned into a single crystal.

Another object of the present invention is to provide a method of manufacturing a single-crystal film in which, within an amorphous or polycrystalline silicon film that is continuously deposited on the surface of a single-crystal substrate and an insulating film overlying the surface, only the parts deposited on the insulating film can be selectively turned into a single crystal.

In order to accomplish the objects, the present invention irradiates a polycrystalline or amorphous semiconductor film, which is continuously deposited on a semiconductor single-crystal substrate and an insulating film, with a laser beam which has an energy intensity slightly lower than critical energy, whereby only those parts of the polycrystalline or amorphous semiconductor film which are deposited on the insulating film are selectively turned into a single crystal.

DETAILED DESCRIPTION OF THE PREFERRED EMBODIMENTS

Figure 2:
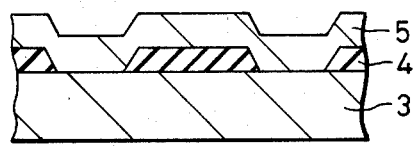
FIG. 2 and FIGS. 3a and 3b are sectional views for explaining an embodiment of the present invention.

As shown in FIG. 2, on desired parts of the surface of a single-crystal silicon substrate 3, an $SiO_2$ film 4, for example, is deposited as an insulating film. Thereafter, a polycrystalline (or amorphous) silicon film 5 is deposited on the whole surface.

When the polycrystalline silicon film 5 is melted by irradiating it with a pulse laser or CW (continuous wave) laser having an intensity not lower than a critical value, the parts of the polycrystalline silicon film lying in contact with the single-crystal silicon substrate 3 are first turned into a single crystal by the liquid epitaxial growth, and the single-crystal regions subsequently extend and grow in the lateral direction, with the result that the parts on the insulating film 4 are also turned into the single crystal.

This method is a very excellent method which can form the continuous single-crystal film on the surface of the single-crystal substrate and the insulating film. Obviously, however, it is extraordinarily useful in practical use that only the polycrystalline or amorphous silicon on the insulating film can be selectively turned into the single crystal, whereas the parts deposited on the single-crystal substrate are left as they are polycrystalline or amorphous without being turned into the single crystal.

Likewise to the above method, the present invention first deposits an insulating film 4 on desired parts of the surface of a single-crystal substrate 3 and further deposits a polycrystalline or amorphous silicon film 5 on the whole surface.

Subsequently, the polycrystalline or amorphous silicon film is irradiated with a laser beam. However, the energy intensity of the laser beam in this case is made slightly lower then the aforementioned critical value.

Thus, the parts of the polycrystalline or amorphous silicon film 5 lying in direct contact with the single-crystal substrate 3 are held intact in the polycrystalline or amorphous state without melting, but the parts deposited on the insulating film 4 are melted.

More specifically, the thermal conductivity of the single-crystal silicon substrate is $1.45 \times 10^{-2}$. Therefore, even when the polycrystalline or amorphous silicon film 5 lying in direct contact with the substrate is heated by the laser irradiation, the heat is radiated through the substrate, so that temperature rise is suppressed and the melting does not develop.

In contrast, the insulating film ($SiO_2$) has a thermal conductivity of $1.3 \times 10^{-2}$ which is lower than that of the substrate, so that the radiation of the heat is little and the melting develops.

In this manner, the parts lying in direct contact with the substrate do not melt, and only the parts on the insulating film melt, so that only the polycrystalline or amorphous silicon film on the insulating film is selectively turned into the single crystal. By properly selecting the conditions of the laser irradiation, it is possible to produce a uniform single-crystal film having no grain boundary.

When this operation of producing the single crystal is compared with the case of turning the insular polycrystalline silicon on the insulating film into the single crystal (refer to FIG. 1b), it is thought in the case of the present invention that strains (shear stresses) from the end parts of the insulating film will act effectively for the formation of the single crystal during heating and cooling, resulting in the better single crystal.

Figure 1A:
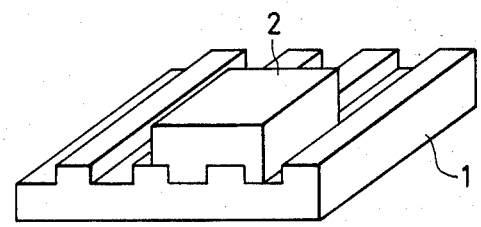
FIGS. 1a and 1b are model diagrams for explaining prior-art methods of manufacturing a single-crystal film.
Figure 1B:
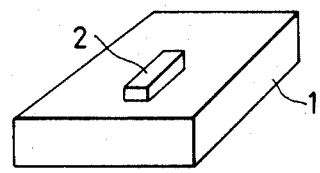

Moreover, in the case shown in FIG. 1b where the insular polycrystalline silicon film is deposited on the insulating film and turned into the single crystal, it has been the serious problem that the shape of the polycrystalline or amorphous silicon film collapses due to the laser irradiation. In the present invention, however, the occurrence of such collapse in the shape is not feared at all because the desired parts of the polycrystalline or amorphous silicon film deposited to be continuous are selectively turned into the single crystal.

Figure 3A:
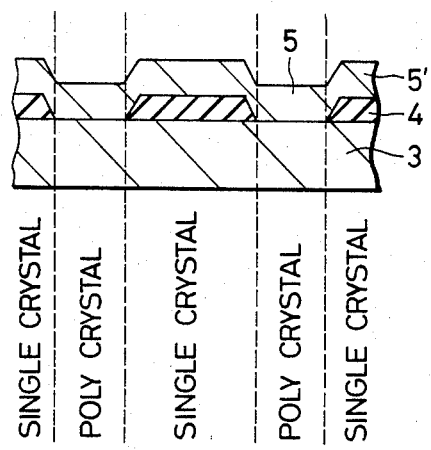

According to the present invention, as illustrated in FIG. 3a, the polycrystalline or amorphous silicon film 5 remains substantially unchanged on the single-crystal substrate 3, and a single-crystal silicon film 5' is selectively formed on only the insulating film 4.

Figure 3B:
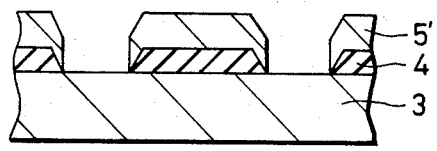

Although even the structure shown in FIG. 3a can be employed for various uses, the remaining polycrystalline or amorphous silicon film 5 can be selectively removed to leave only the single-crystal silicon film 5' as illustrated in FIG. 3b, by performing etching with an etchant of high selectivity. This is based on the fact that the polycrystalline or amorphous silicon is much higher in solubility than the single-crystal silicon.

In the present invention, either a pulse laser or a CW (continuous wave) laser can be used. The energy intensity of the irradiating laser beam needs to fall within a predetermined range.

When the energy intensity is excessive, not only the parts of the polycrystalline or amorphous silicon overlying the insulating film, but also those overlying the single-crystal substrate melt and turn into the single crystal.

On the other hand, when the energy intensity of the irradiating laser beam is too low, the parts of the polycrystalline or amorphous silicon film overlying the insulating film do not melt, either, so that the single-crystal film cannot be produced.

In the present invention, the preferable range of energy densities of the laser beam differs to some extent, depending upon the thickness of the polycrystalline or amorphous silicon film which is to be turned into the single crystal. As the film is thicker, a higher energy density is required.

By way of example, when the thickness of the film is about 300–500 nm, favorable results are obtained at approximately 1.2 J/cm$^2$ with a Q-switched pulse laser (ruby) or at approximately 7 W with a CW argon laser having a beam diameter of 50 μm; when it is about 500–700 nm, they are obtained at approximately 1.5 J/cm$^2$ with the former laser or at approximately 8–9 W with the latter laser; and when it is about 700 nm–1 μm, they are obtained at approximately 2 J/cm$^2$ with the former laser or at approximately 10 W with the latter laser. In addition, the intensity of the CW argon laser having the same beam diameter, which is suited to a thickness of 100 nm, is approximately 5 W, and that of the Q-switched pulse layer is approximately 1 J/cm$^2$.

Even when any of these energy densities has increased or decreased by about ±10%, favorable results are obtainable.

Needless to say, the energy of the laser beam for the irradiation can be changed in a considerable wide range by varying the beam diameter or scanning speed of the laser beam.

In the present invention, not only the Q-switched ruby laser or the CW argon laser, but also various other lasers can be used for the irradiation. In this regard, the preferable range of irradiating intensities is somewhat different depending upon the wavelengths of the respective lasers. Therefore, the irradiating intensity is properly adjusted in correspondence with the kind of the laser to be used. In case of a YAG laser which is one sort among lasers used most extensively, the range of irradiating beam intensities which produces favorable results is substantially the same as that of the aforementioned ruby laser.

When the polycrystalline or amorphous silicon film to be turned into the single crystal is too thin, it becomes difficult to form a semiconductor element having a junction, within the single-crystal silicon film produced. On the contrary, when the film is too thick, it becomes difficult to turn this film completely into the single crystal by the laser irradiation.

For the above reasons, the thickness o the polycrystalline or amorphous silicon film should preferably be made about 100 nm–1 μm in practical use.

EXAMPLE

As shown in FIG. 2, on the (100) plane of a single-crystal silicon substrate 3, strips of an SiO$_2$ film 4 having a width of 4 μm and a thickness of 250 μm were formed at intervals of 2 μm by the use of the well-known thermal oxidation and photolithography. Thereafter, using the well-known CVD process, a polycrystalline silicon film 5 having a thickness of about 400 nm was formed over the whole surface.

The entire surface of the polycrystalline silicon film 5 was scanned by a continuous wave (CW) argon laser, to melt the parts of the polycrystalline silicon film 5 deposited on the SiO$_2$ film 4. Then, a single-crystal silicon film 5' was formed on the SiO$_2$ film 4 as illustrated in FIG. 3a.

In the present example, an energy intensity was 5–6 W when the beam diameter of the laser was about 30 μm, and it was 3–4 W when the beam diameter was about 20 μm. Good results were obtained in both the cases.

In case of employing the CW laser, also the scanning speed has influence on the result. In the present example, the scanning speed was set at 10–25 cm/second with respect to the aforementioned energy intensities. Good results were obtained in both the cases, and it was appreciated favorable to set the scanning speed in the specified range.

Subsequently, etching was performed by the use of an etchant which had a composition consisting of fluoric acid 1: nitric acid 50: glacial acetic acid 25. Then, since the etching rate of polycrystalline silicon by the etchant is much higher than that of single-crystal silicon, the polycrystalline silicon film 5 lying in direct contact with the silicon substrate 3 was etched and removed, and only the single-crystal silicon film 5' overlying the insulating film 4 was left as shown in FIG. 3b. The etching in this case is not restricted to the wet etching employing the liquid etchant, but dry etching may be relied on and can achieve a similar result.

Even when amorphous silicon films formed by the vacuum evaporation, the plasma process, etc. were used instead of the polycrystalline silicon film, the same results as in the case of employing the polycrystalline silicon could be obtained.

Regarding the laser beam for the irradiation, not only the CW laser, but also pulse lasers of ruby, YAG, etc. can produce good results. In case of the pulse laser, however, the accurate control of the dose of irradiation is somewhat difficult because of an extremely short irradiation time. Accordingly, the CW laser is more convenient in practical use.

For the sake of convenience, the above description has been made of the case of projecting the laser beam. Needless to say, however, not only the laser beam, but also the electron beam may be used which can heat and melt selected parts of the film.

As that semiconductor film on the insulating film which can be turned into the single crystal by the laser irradiation, there can be used, not only the silicon film, but also any other semiconductor film.

For example, a GaAs film replacing the polycrystalline silicon film is continuously deposited on a single-crystal substrate and an insulating film of $SiO_2$ or the like by the well-known CVD, molecular beam epitaxy or the like, and a continuous-wave argon laser has its output adjusted properly and is caused to scan the whole surface of the film. Then, single-crystal GaAs can be formed on the insulating film with polycrystalline GaAs left on the substrate.

Accordingly, when the resultant substrate is subsequently processed by an etching method of high selectivity, for example, by the use of a methanol solution containing 1% of bromine, the polycrystalline GaAs is removed to leave only the single-crystal GaAs on the insulating film, likewise to the case of silicon shown in FIG. 3b.

In this manner, single-crystal films of silicon and compound semiconductors can be formed on selected parts of various single-crystal substrates of silicon etc. through insulating films. Using the resultant structures, therefore, various semiconductor devices of constructions which have heretofore been impossible can be formed.

Moreover, since only the desired parts of the polycrystalline or amorphous semiconductor film are selectively melted into the single crystal, it is not feared that the shape of the film to be obtained will collapse as in the case of the prior-art method illustrated in FIG. 1b, and the thickness of the shape can be accurately controlled.

For convenience sake, the above description has been made of the case of using the $SiO_2$ film as the insulating film and the single-crystal silicon as the substrate. Needless to say, however, the present invention is not restricted to them.

More specifically, as the insulating film, it is possible to use, not only the $SiO_2$ film, but also films of various insulators such as an $Al_2O_3$ film and an $Si_3N_4$ film. As the substrate, it is possible to use, not only the single-crystal silicon, but also a material whose thermal conductivity is greatly different from that of the insulating film and which has a high mechanical strength.

As apparent from the foregoing description, according to the present invention, a good single-crystal semiconductor film can be selectively formed on an insulating film very easily. Therefore, it becomes possible to form semiconductor devices of novel structures not having heretofore been seen, and very great merits are obtained.

What is claimed is:

1. A method of manufacturing a single-crystal film, comprising:
    (1) a step of forming an insulating film in a desired position on a single-crystal substrate to provide a pattern with openings through which portions of the surface of said single-crystal substrate are exposed, said insulating film having a thermal conductivity lower than the thermal conductivity of said single-crystal substrate;
    (2) a step of depositing a polycrystalline or amorphous semiconductor film to continuously cover said exposed surface portions of said substrate and said insulating film; and
    (3) a step of irradiating a whole surface of said polycrystalline or amorphous semiconductor film with a laser beam or electron beam having an energy intensity below a critical energy so that the beam will not cause the polycrystalline or amorphous semiconductor film deposited on the substrate to turn into a single crystal and whereby those portions of said polycrystalline or amorphouse semiconductor film which are deposited on said insulating film are selectively melted and turned into a single crystal.

2. A method of manufacturing a single-crystal film as defined in claim 1, further comprising, after the irradiating step, a step of selectively removing the polycrystalline or amorphous semiconductor film which has remained without being turned into the single crystal.

3. A method of manufacturing a single-crystal film as defined in claim 1 or 2, wherein said polycrystalline or amorphous semiconductor film is a silicon film or a compound semiconductor film.

4. A method of manufacturing a single-crystal film as defined in claim 3, wherein said insulating film is selected from the group consisting of an $SiO_2$ film, an $Si_4N_4$ film and an $Al_2O_3$ film.

5. A method of manufacturing a single-crystal film as defined in claim 3, wherein said polycrystalline or amorphous silicon film is about 100 nm–1 $\mu$m thick.

6. A method of manufacturing a single-crystal film as defined in claim 5, wherein said polycrystalline or amorphous silicon film is irradiated with the laser beam by a Q-switched ruby or YAG pulse laser which has an intensity of approximately 1–2 $J/cm^2$.

7. A method of manufacturing a single-crystal film as defined in claim 5, wherein said polycrystalline or amorphous silicon film is irradiated with the laser beam by a CW argon laser which has an intensity of approximately 5–7 W and a beam diameter of approximately 50 $\mu$m.

8. A method of manufacturing a single-crystal film as defined in claim 4, wherein said polycrystalline or amorphous silicon film is about 100 nm–1 $\mu$m thick.

9. A method of manufacturing a single-crystal film as defined in claim 8, wherein said polycrystalline or amorphous silicon film is irradiated with the laser beam by a Q-switched ruby or YAG pulse laser which has an intensity of approximately 1–2 $J/cm^2$.

10. A method of manufacturing a single-crystal film as defined in claim 8, wherein said polycrystalline or amorphous silicon film is irradiated with the laser beam of a CW argon laser which has an intensity of approximately 5–7 W and a beam diameter of approximately 50 μm.

11. A method of manufacturing a single-crystal film as defined in claim 1 or 2, wherein said insulating film is selected from the group consisting of an $SiO_2$ film, an $Si_3N_4$ film and an $Al_2O_3$ film.

12. A method of manufacturing a single-crystal film as defined in claim 11, wherein said insulating film has a thermal conductivity of $1.3 \times 10^{-2}$.

13. A method of manufacturing a single-crystal film as defined in claim 1, wherein said openings in said insulating film are formed by thermal oxidation and photolithography.

14. A method of manufacturing a single-crystal film as defined in claim 1, wherein said substrate is a single-crystal silicon substrate.

15. A method of manufacturing a single-crystal film as defined in claim 14, wherein said single-crystal silicon substrate has a thermal conductivity of $1.45 \times 10^{-2}$.

16. A method of manufacturing a single-crystal film as defined in claim 1, wherein those portions of said polycrystalline or amorphous semiconductor film which are deposited on said single-crystal substrate are not melted.

17. A method of manufacturing a single-crystal film as defined in claim 1, wherein the said critical energy is changed by varying the beam diameter or scanning speed of the laser beam.

18. A method of manufacturing a single-crystal film as defined in claim 1, wherein said critical energy is changed proportionately in relation to the thickness of said polycrystalline or amorphous semiconductor film.

* * * * *